United States Patent [19]

Wagner et al.

[11] Patent Number: 5,180,000
[45] Date of Patent: * Jan. 19, 1993

[54] WORKPIECE CARRIER WITH SUCTION SLOT FOR A DISK-SHAPED WORKPIECE

[75] Inventors: Rudolf Wagner, Fontnas; Hans Hirscher, Bad Ragaz, both of Switzerland

[73] Assignee: Balzers Aktiengesellschaft, Furstentum, Liechtenstein

[*] Notice: The portion of the term of this patent subsequent to Jul. 23, 2008 has been disclaimed.

[21] Appl. No.: 694,680

[22] Filed: May 2, 1991

Related U.S. Application Data

[63] Continuation-in-part of Ser. No. 520,030, May 7, 1990, Pat. No. 5,033,538.

[30] Foreign Application Priority Data

May 8, 1989 [DE] Fed. Rep. of Germany ....... 3915039

[51] Int. Cl.⁵ .......................... F28F 7/00; C23C 16/46; B25B 11/00
[52] U.S. Cl. ...................... 165/80.1; 269/21; 118/725; 118/728
[58] Field of Search .............................. 165/80.1, 80.4; 118/724, 725, 728; 269/20, 21

[56] References Cited

U.S. PATENT DOCUMENTS

| | | | |
|---|---|---|---|
| 4,139,051 | 2/1979 | Jones et al. | 165/80.1 |
| 4,183,545 | 1/1980 | Daly | 269/21 |
| 4,403,567 | 9/1983 | Dacosta et al. | 269/21 |
| 4,448,404 | 5/1984 | Ogawa et al. | 269/21 |
| 4,508,161 | 4/1985 | Holden | 165/80.1 |
| 4,603,466 | 8/1986 | Morley | 269/21 |
| 4,721,462 | 1/1988 | Collins, Jr. | 269/21 |
| 4,909,314 | 3/1990 | Lamont, Jr. | 118/725 |
| 4,949,783 | 8/1990 | Lakios et al. | 165/80.1 |
| 4,955,590 | 9/1990 | Narushima et al. | 269/21 |
| 5,033,538 | 7/1991 | Wagner et al. | 165/80.1 |

Primary Examiner—John Rivell
Assistant Examiner—L. R. Leo
Attorney, Agent, or Firm—Notaro & Michalos

[57] ABSTRACT

For the transmission of heat under vacuum conditions to a workpiece, a carrier is used with gas outlets and gas return openings distributed on its surface. A dynamic gas layer is thus formed between the carrier and the workpiece wherein the gas effects thermal conduction between the carrier and the workpiece. The gas outlets terminate in a distribution space implemented as a groove and has at least on slot shaped aperture extending substantially around most of the carrier periphery.

7 Claims, 3 Drawing Sheets

WORKPIECE CARRIER WITH SUCTION SLOT FOR A DISK-SHAPED WORKPIECE

CROSS-REFERENCE TO RELATED APPLICATION

This is a continuation-in-part of Ser. No. 07/520,030 filed May 7, 1990 entitled WORKPIECE CARRIER FOR A DISK-SHAPED WORKPIECE AS WELL AS A VACUUM PROCESS SPACE, which is now U.S. Pat. No. 5,033,538.

FIELD AND BACKGROUND OF THE INVENTION

The present invention relates to a workpiece carrier for a disk-shaped workpiece having a workpiece support with a cooling and/or heating device. The workpiece support is penetrated by a multiplicity of exit apertures communicating with a distribution space which is connected in turn to a gas feed line to form, with a gas supplied to the distribution space and between the workpiece and the workpiece support, a cushion-like gas layer. The gas acts as heat transmission means. The invention also includes a vacuum process space for the treatment of workpieces with such a workpiece carrier.

German patent document DE-A-36 33 386 discloses a carrier for a disk-shaped workpiece, namely a substrate, of the initially described type. For the treatment of such a workpiece in a vacuum treatment process, it is known therefrom to provide a recess in a seating block, corresponding essentially to the extent of the substrate. The recess is connected to a centrally disposed gas feed line. A multiply-perforated disk is placed in the recess, over which the substrate to be treated is laid. The disk and the recess in the block thus bounds a distribution space for the gas so that, with gas flowing over the gas feed line, the distributing space and the exit apertures, a gas cushion is formed between the substrate and the workpiece support which acts as heat transmission means.

In this known seating the gas forming the gas cushion exits at the periphery of the substrate into the environment which is often undesirable in particular when using such a seating in a vacuum treatment process for the substrate. It is true that in some vacuum treatment processes a particular gas is supplied into the process space in defined quantities, however, in many cases it is desired to supply this process gas independently of a ubiquitous gas feed on the seating for heat transmission purposes.

SUMMARY OF THE INVENTION

The present invention seeks, in a seating of the above mentioned type, an arrangement where the gas used as the heat transmission means does not exit into the environment around the seating, and where the seating is as simple as possible in terms of construction. By retaining the use of a gas as the heat transmission means it is possible therein to carry out the treatment of the workpiece at particular temperatures to be maintained precisely.

The portion of the present invention defined in the preamble of the claims as well as the feature wherein the support surface includes both the exit apertures for the gas, and a multiplicity of suction or drawing-off apertures communicating with a gas suction space, rests on personal and confidential discussions by the inventors of the present application with Mr. J. Visser of Philips Research Laboratories, Eindhove, the Netherlands, on information from the latter regarding the subject matter of a German Divisional application No. 39 43 347.8. The present application relates in particular to the improved implementation of the distribution space in the form of one or several grooves formed in a plate. In this connection the term "groove" as used herein is understood to mean a recess machined or formed into a body whose longitudinal extent is significantly greater than the two orthogonal dimensions of its cross sectional area, i.e. a channel-like flute.

BRIEF DESCRIPTION OF THE DRAWINGS

The invention will now be discussed by example in conjunction with the drawings wherein.

DESCRIPTION OF THE PREFERRED EMBODIMENT

Figure 1:
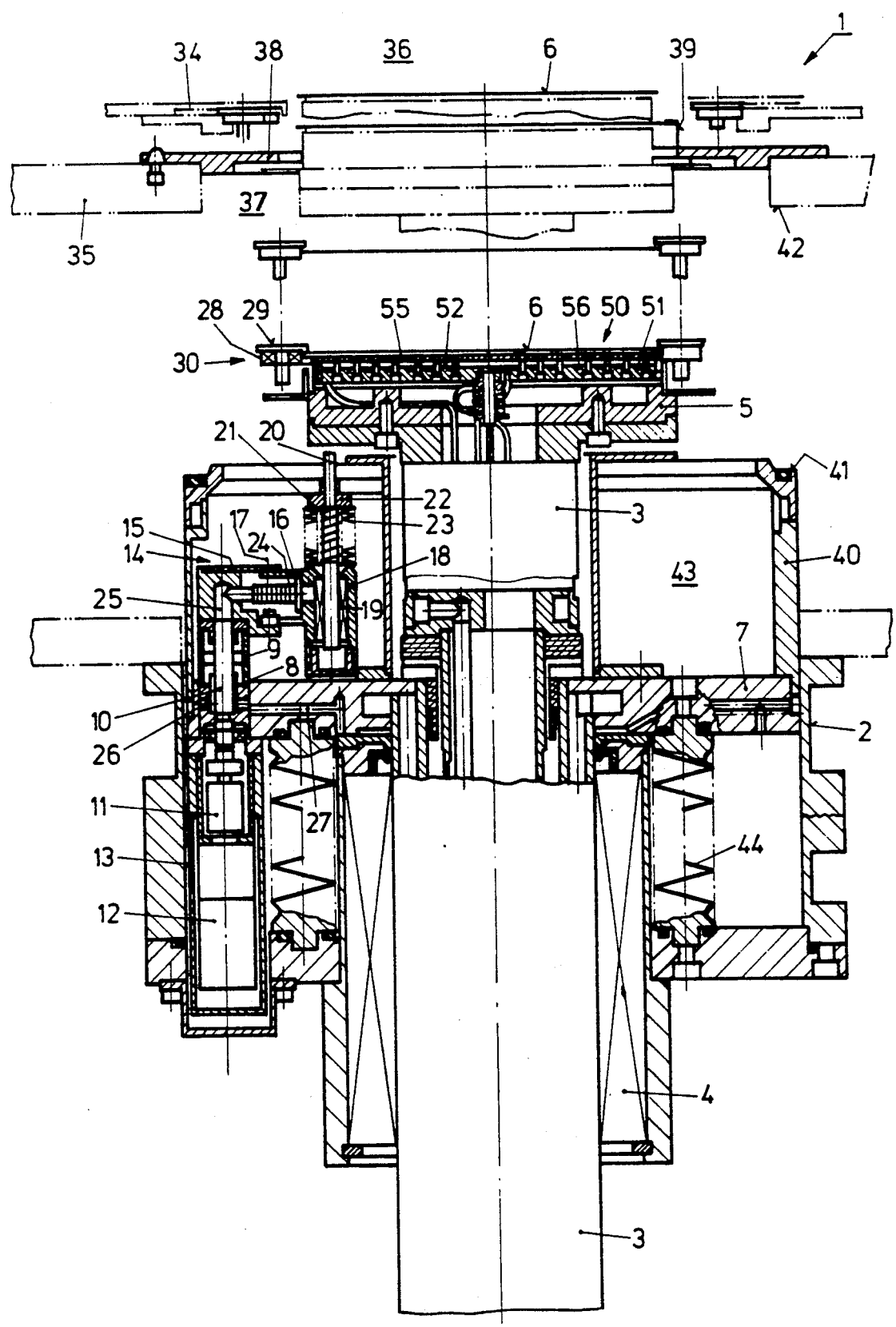
FIG. 1 is a vertical section taken on line II—II in FIG. 2 through a carrier arrangement for a disk-shaped workpiece whose different positions with respect to a treatment chamber loaded by the arrangement are shown in dash-dot lines and which comprises a carrier according to the invention.

The carrier arrangement represented in FIG. 1 in vertical section, denoted below as elevating table 1, has a housing 2 implemented in step-form, in which a column 3 is supported for up and down movement by means of a bearing 4. The bearing is formed by a ball bearing case which has a device (not shown) operation on the principle of a cooperating slot and spring arrangement to support the column 3 in the housing 2 in a torsion-free manner. At its upper end, the column 3 carries a workpiece seating 5 positioned coaxially to the axis of the column on which a disk-shaped workpiece 6 rests. At a distance below the workpiece seating 5 the column 3 carries an annular flange 7 in which, according to FIG. 1 three recesses 8 are formed. Recesses 8 are distributed on the circumference of the flange and penetrate the annular flange. One seating body 9 is positioned in each recess. In each seating body 9 a shaft 10 is rotatably supported which at its lower end is connected via coupling elements 11 to a micromotor 12. This micromotor is positioned below the annular flange 7 in a housing 13 fastened at the underside of the annular flange. At the upper end the shaft 10 carries a two-element jib 14 extending at a right angle to the shaft axis. The jib comprises two elements 15 and 16 connected through a pivot axis 17 parallel to the shaft, so that the external jib element 16 compared to the jib element 15 fastened at the top on shaft 10, is pivotable. The jib 14 caries at the other end a seating body 18 in which, by means of a ball bearing case 19, a rod 20 parallel to the axis of the shaft 10 is supported for axially movement. The rod 20 is held axially displaceably against the action of a pressure spring 21 surrounding the rod which moves the pressed-down rod 20 upwardly again. For this purpose the pressure spring 21 is braced with its lower end on the seating body 18 and with the upper end on a flange 22 fastened on the rod. On flange 22 further the one end of a metal bellows 23 is fastened whose other end is fastened on the seating body 18. Thereby within the metal bellows 23 and the adjoining seating body closed off at the lower end, a closed chamber is present in which terminates a flexible line 24 extending on the inside through the jib 14 which is flexible so that the two elements 15 and 16 of the jib 14 can be pivoted toward each other. The shaft 10 is hollow and to this hollow space 25 the flexible line 24 is connected. At the motor-side end of shaft 10 the hollow space 25 is connected via transverse bores 26 to a channel 27 extending through the annular flange 7 in the radial direction which in a manner not shown is connected to a vacuum source so that all previously cited chambers that are connected to each other, can be evacuated. Particles which potentially are generated through abrasion can be suctioned off and do not reach the likewise evacuated chamber in which the elevating table operates. Likewise from the seatings 9 and 18 no foreign bodies can reach this chamber.

Figure 2:
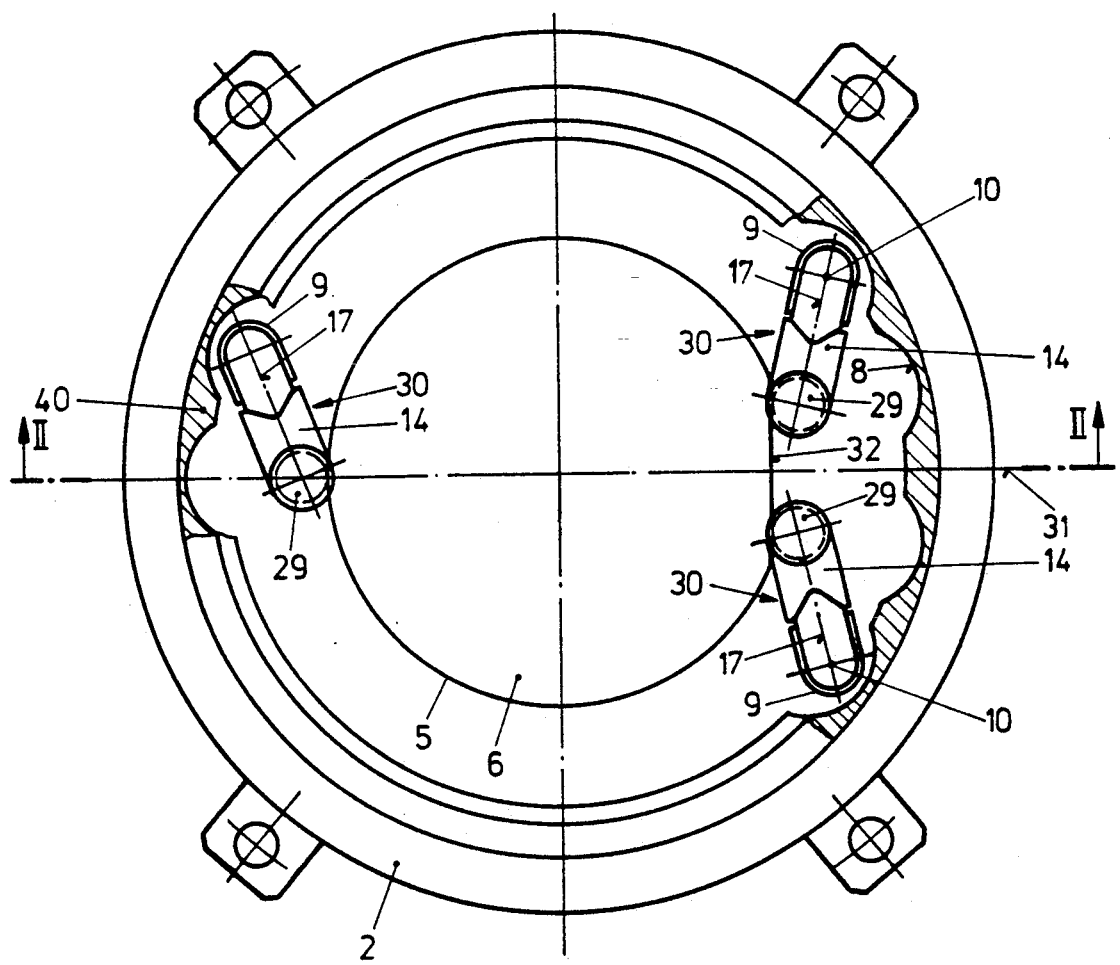
FIG. 2 is a top view of the essential parts of the carrier arrangement with holding elements.

Although FIG. 1 represents a vertical section through the jib and the adjoining parts lying in the plane of the drawing, in reality the jib 14 extends at an angle to the vertical section plane through the elevating table 1 as is apparent in FIG. 2 so that the previously described rod 20 in reality ends laterally next to the workpiece seating 5. At the end rod 20 carries a rotary ring for example in the form of a roller bearing 28 and above the roller bearing a disk 29 which extends over the edge of the disk-shaped workpiece 6 lying on the workpiece seating 5 to hold the workpiece tightly. The rotary ring 28 allows a rolling-off motion if the rod 20 is pressed, through pivoting of the shaft 10 during a pivoting motion triggered by the micromotor 12, against the workpiece 6 in order to correct the position of the workpiece on the workpiece seating. The rod as an active element and all parts described above for the seating and pivoting motion of the rod by means of the micromotor, are collectively referred to as a holding element 30 which has still additional functions.

As is apparent in FIG. 2, a total of three holding elements 30 are present of which one lies with its rod 20 and the upper disk 29 on the line of symmetry 31 through the workpiece seating and two further holding elements 30 lie on both sides of the line of symmetry and diametrically opposed to the one holding element. As can be seen in the top view according to FIG. 2, the disk seating 5 and the disk-shaped workpiece 6 lying thereon have the same outline form, namely circular with a straight edge 32 extending on one side along a chord. Against this edge initially the two holding elements 30 which lie on both sides of the line of symmetry 31, are pressed by pivoting the holding element about the axis of the shaft 10 by means of motor 12. The straight edge 32 of the disk-shaped workpiece 6 is also referred to as a "flat". Subsequently the holding element 30 lying opposite the two, is pivoting and pressed against the workpiece and if this was originally positioned with the straight edge 32 not precisely parallel to the holding elements 30 lying next to one another on the workpiece seating, the workpiece is brought through the opposing holding element to rest against the two holding elements. If this workpiece is for example a semiconductor disk the disk orientation is thereby corrected which is important for the subsequent treatment steps.

The position of the engaged holding elements is also represented in FIG. 1 in the lower and in the middle position of the elevating table which can be moved up and down, while the disengaged position brought about through a pivot motion is shown in FIG. 1 at the very top. According to this view, the holding element is pivoted only by one small angle and reaches the position in which it is disengaged under a covering 34 against which the rod 20 is pressed during the raising of the workpiece support 5 so that the rod is pressed inwardly against the action of the spring 21. In this raised position the workpiece support 5 projects into a process chamber 36 located above a vacuum chamber wall 35 wherein the holding element 30 then lies protected under the covering 34 so that the treatment of the workpiece surface, for example a coating with aluminum or an etching process taking place in the process chamber 36 cannot effect the holding elements lying protected. Hence no coating can grow on the holding elements.

Between the workpiece seating 5 and the vacuum chamber wall 35 an open annular gap 37 is present which is covered by a loose ring 38 assigned to the seating which is provided on the inner circumference with several hooks 39 with which the ring 38 is suspended at the edge of the workpiece 6 if the workpiece seating 5 is in the raised position. The ring serves as a weight load and simultaneously fixes the workpiece.

The annular flange 7 fixedly mounted on the column 3 is fixedly connected at its outer edge, to a cylinder body 40 coaxial to the column 3. The upper surface of body 40 has a ring surface 41 lying lower than the workpiece seating 5 and implemented as a valve closure element which comes to rest in contact against an annular surface 42 on the vacuum chamber wall 35 implemented as a valve seat when the elevating table is raised in the working station so that in this position the workpiece seating 5 projects into the working or process chamber 36 and simultaneously this chamber is sealed against the adjacent space. Between the column 3 and the cylinder body 40 fastened on the annular flange 7, an annular space 43 is present in which are accommodated the essential parts of the holding elements 30 of which only the rods 20 extend upwardly out of the annular space 43.

A metal bellows 44, whose upper end is fastened to the underside of the annular flange 7 and whose lower end is fastened on the floor of the housing 2, allows the up and down motion of the workpiece seating 5 in a space which likewise is evacuated and which is connected to the space below the annular flange 7 and by means of the metal bellows 44 can therefore be separated from the remaining space extending below the flange 7.

The elevating table represented in FIG. 1 and according to the invention, permits a particular treatment of a workpiece 6 in the process chamber 36 at a particular temperature of a temperature distribution, which is to be precisely controllable, for example maintained constant.

Figure 3:
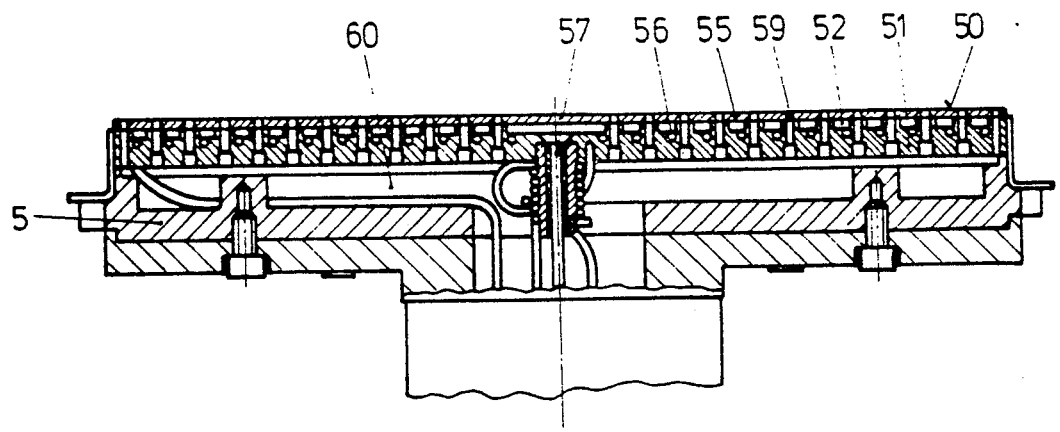
FIG. 3 illustrates the workpiece carrier according to the invention as shown in FIG. 1, in vertical section taken on line III—III of FIG. 4, with the details from FIG. 1 on an enlarged scale.

To carry out the treatment at a high temperature therefore the upper part of the workpiece seating 5 is equipped with an electrical heating device 50. This is represented in FIG. 3 on a greater scale and in vertical section. This heating device has a plate 51 in which in uniform distribution over the plate surface circular grooves 52 are formed with a cross-section offset in a steplike manner, as shown in FIG. 4.

Figure 4:
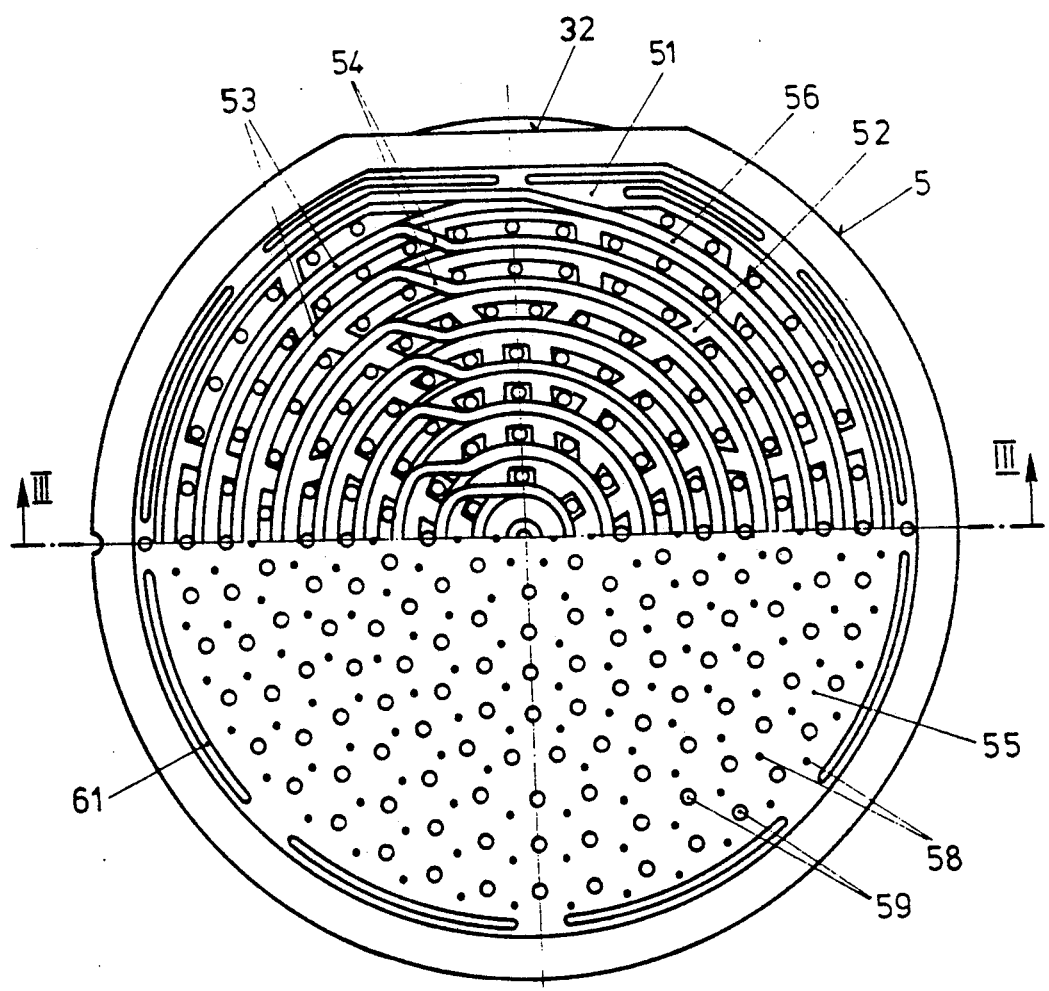
FIG. 4 is a top view of the carrier according to FIG. 3 represented in one half without it covering plate.

The lower lying regions of grooves 52 which lie on circles 53 concentric with respect to each other, which are connected through connecting sections 54 from one to the next circle, form a flute starting from the center of the gas flow plate, toward the outside and extending on a continuous line for receiving a heating element coil 56 as is apparent in FIG. 4, which shows in its upper half, a top view of the plate 51. In the other half of FIG. 4 the top view of a further plate 55 is represented which covers the gas flow plate 51 and is connected to it. Through this further covering plate 55 the grooves 52, distributed over the entire plate surface and in addition also connected with each other in the radial direction, are covered so that channels for gas distribution are formed.

As is apparent in FIG. 3, each groove 52 is implemented so as to be offset in cross-section in a steplike manner and consists of a wide upper and a narrower lower region in which the electrical heating element coil 56 is positioned which extends from the plate center to the edge of the plate. The upper wide groove region forms a distribution space connected to a channel 57 terminating in the center of the plate in the grooves 52 for the purpose of feeding in gas. The covering plate 55 has a multiplicity of small bores 58 penetrating the plate and distributed over its surface, for example regularly distributed, which bores terminate in the grooves 52. Through these bores 58 the gas flowing through the grooves 52 exits to form a layer subsequently between the surface of the plate 55 and the workpiece lying thereon. The gas therein has the task of increasing heat transmission from the surface of the plate 55 to the reverse side of the workpiece. In addition, the gas ensures that the workpiece in a controlled manner over its entire surface is for example heated uniformly. In this manner the workpiece can be heated for example to 500° C. To draw off the gas again the plate 51 and the covering plate 55 has a multiplicity of moderately large bores 59 in alignment penetrating and distributed over the plate surface, for example regularly positioned, however next to the grooves 52 and along the same. These terminate below the plate 51 in a gas drawing-off or suction space 60 from which the gas is drawn off. Slot-shaped apertures 61 along the plate edge serve likewise for gas suctioning to ensure that the gas does not reach the process space.

The dynamic gas cushion serving for the uniform heating of workpiece 6 is to become effective after the workpiece raised by means of the elevating table is located in the process chamber 36 according to FIG. 1. So that the workpiece 6 is not lifted by the gas cushion or the gas layer from the workpiece seating 5, the workpiece 6 is weighted by the weight of the loose ring 38 which hangs at the edge of workpiece 6 with the aid of the hooks 39 fastened to the ring.

Without operating the heating element spiral the gas cushion and the gas inlet and outlet serves in particular also for cooling a workpiece or for carrying off heat.

If necessary, instead of a heating device a cooling device can be provided, for example with cooling medium lines instead of the heating coil or in one of the plates forming the carrier. Furthermore, the gas collection space or both spaces could also be constructed in the shown groove construction.

Returning to FIGS. 3 and 4, outer slot-shaped apertures or grooves 61 may be replaced by a single groove which extends virtually around the entire periphery of the cover plate 55, the object being to provide one or more grooves that substantially extend around the entire periphery of the plate to avoid leakage of gas into the process space. To further insure that this happens, the mass fluid rate of gas per unit time drawn from slots 61 into the suction space 60 should be at least equal to the mass fluid rate of gas being introduced through the feed channel 57 and its feed bores 58.

As clearly evident from FIGS. 3 and 4, gas being suctioned through slot 61, moves along a path into the large suction space, with a cross-sectional area of the path not smaller than the cross-sectional area of the slot to avoid any flow restriction between the slot and the suction space.

While a specific embodiment of the invention has been shown and described in detail to illustrate the application of the principles of the invention, it will be understood that the invention may be embodied otherwise without departing from such principles.

What is claimed is:

1. In a workpiece carrier for a disk-shaped workpiece, subjected to a surface treatment in a vacuum installation and having a workpiece support forming a support surface with an outer periphery and for supporting the workpiece, at least one exit aperture terminating in the support surface, a gas feed connected to said at least one exit aperture for supplying a gas to said exit aperture to form a heat transferring gas layer between said support surface and said workpiece, the improvement comprising:
   the support surface including, in addition to said exit aperture, at least one suction aperture, said suction aperture being formed as at least one slot extending along a substantial portion of the periphery of said support surface and;
   gas suction means connected to said at least one slot for suctioning gas from said slot which comes from said at least one exit aperture, so that a dynamic gas seal is formed at said periphery, said slot having a cross-sectional area and communicating with said suction means along a communication path with a cross-sectional area not smaller than that of said slot considered in a flow direction of gas suctioned through said slot by said gas suction means.

2. The improvement of claim 1, wherein said gas suction means defines a distribution space formed by a groove, and includes a covering plate covering the groove and forming the workpiece support, the groove being directly connected to said at least one slot.

3. The improvement of claim 2, including a plurality of said slots extending around sections of the periphery.

4. The improvement of claim 2, said at least one exit aperture extending through said covering plate.

5. The improvement of claim 4, wherein said gas suction means includes means for suctioning gas from said slot at a mass fluid rate per unit time which is at least equal to a mass fluid rate per unit time of gas supplied by said gas feed.

6. The improvement of claim 5, including a heating coil in the groove.

7. In a workpiece carrier for a disk-shaped workpiece, subjected to a surface treatment in a vacuum installation and having a workpiece support forming a support surface with an outer periphery and for supporting the workpiece, at least one exit aperture terminating in the support surface, a gas feed connected to said at least one exit aperture for supplying a gas to said exit aperture to form a heat transferring gas layer between said support surface and said workpiece, the improvement comprising:

the support surface including, in addition to said exit aperture, at least one suction aperture, said suction aperture being formed as at least one slot extending along a substantial portion of the periphery of said support surface;

gas suction means connected to said at least one slot for suctioning gas from said slot which comes from said at least one exit aperture, so that a dynamic gas seal is formed at said periphery, said slot having a cross-sectional area and communicating with said suction means along a communication path with a cross-sectional area not smaller than that of said slot considered in a flow direction of gas suctioned through said slot by said gas suction means;

said gas suction means defining a distribution space formed by a groove, and including a covering plate covering the groove and forming the workpiece support, the groove being directly connected to said at least one slot;

said at least one exit aperture extending through said covering plate;

said gas suction means including means for suctioning gas from said slot at a mass fluid rate per unit time which is at least equal to a mass fluid rate per unit time of gas supplied by said gas feed; and a heating coil in the groove.

* * * * *